(12) United States Patent
Tsao et al.

(10) Patent No.: US 7,256,120 B2
(45) Date of Patent: Aug. 14, 2007

(54) METHOD TO ELIMINATE PLATING COPPER DEFECT

(75) Inventors: Jung-Chin Tsao, Taipei (TW); Chi-Wen Liu, Hsinchu (TW); Hsien-Ping Feng, Yonghe (TW); Hsi-Kuei Cheng, Jhubei (TW); Steven Lin, Shih-Chu (TW); Min-Yuan Cheng, Taipei (TW)

(73) Assignee: Taiwan Semiconductor Manufacturing Co. (TW)

( * ) Notice: Subject to any disclaimer, the term of this patent is extended or adjusted under 35 U.S.C. 154(b) by 212 days.

(21) Appl. No.: 11/024,917

(22) Filed: Dec. 28, 2004

(65) Prior Publication Data

US 2006/0141768 A1    Jun. 29, 2006

(51) Int. Cl.
*H01L 21/4763*    (2006.01)

(52) U.S. Cl. .................................. 438/622; 438/618

(58) Field of Classification Search ................ 438/618, 438/622
See application file for complete search history.

(56) References Cited

U.S. PATENT DOCUMENTS

| | | |
|---|---|---|
| 6,194,307 B1 | 2/2001 | Chen et al. |
| 6,258,223 B1 | 7/2001 | Cheung et al. |
| 6,383,928 B1 * | 5/2002 | Eissa ........................... 438/687 |
| 6,395,642 B1 * | 5/2002 | Liu et al. ..................... 438/720 |
| 6,582,569 B1 | 6/2003 | Chiang et al. |
| 2003/0176064 A1 * | 9/2003 | Lu et al. ...................... 438/687 |
| 2006/0033678 A1 * | 2/2006 | Lubomirsky et al. ......... 345/32 |

* cited by examiner

*Primary Examiner*—M. Wilczewski
*Assistant Examiner*—Pamela E Perkins
(74) *Attorney, Agent, or Firm*—Duane Morris, LLP

(57) ABSTRACT

A method of forming a metal layer with reduced defects comprising providing a structure having a dielectric layer formed over it, forming a dielectric layer having an opening, lining the opening with a metal seed layer, treating the metal seed layer with a cleaning process to remove contaminates from it, and forming a metal layer upon the metal seed layer.

17 Claims, 5 Drawing Sheets

METHOD TO ELIMINATE PLATING COPPER DEFECT

BACKGROUND

Electrochemical plating (ECP) is a copper (or other metal) deposition technique that is being developed and is likely to become the preferred commercial filling process. In this method, a wafer is immersed in a copper electrolytic bath. Since the wafer is electrically biased with respect to the bath, copper electrochemically deposits on the wafer in a generally conformal process. Electroless plating techniques are also available. Electroplating and its related processes are advantageous because the processes can be performed with simple equipment at atmospheric pressure, deposition rates are high, and liquid processing is consistent with subsequent chemical mechanical polishing.

Electroplating, however, imposes several requirements. A copper seed and adhesion layer is required on top of the barrier layer, such as of Ta/TaN, to nucleate the electroplated copper and adhere it to the barrier material. A good conductive seed and adhesion layer must be deposited if the electroplating is to effectively fill the bottom of the via hole.

A copper seed layer deposited over the barrier layer is typically used as the electroplating electrode. However, the layer's integrity must be assured, and a continuous, smooth and uniform film is preferred. Otherwise, the electroplating current will be directed only to the areas covered with copper or may be preferentially directed to areas covered with thicker copper.

Copper electroplating is commonly used for producing low-resistance and reliable interconnections. For damascene processes, the trench and via are first defined and a thin barrier layer of about 300 Å thickness and a copper seed layer of about 2000 Å thickness are arranged on the wafer surface before copper electrochemical plating. Because ECP is performed in a liquid state, the electrolytic solution must completely cover the surface to achieve a uniform copper deposition.

However, since the wafer surface is not smooth, a superfill process is needed and can be achieved through additional additives often comprising polymer chains that degrade the wetting ability between the electrolytic solution and the copper seed layer. A measure of wetting ability is contact angle, i.e., the greater the contact angle, the poorer the wetting ability of the surface, and conversely, the less the contact angle, the better the wetting ability of the surface. Poor wetting ability often leads to defects in the ECP examples of which are shown in FIGS. 1a and 1b. In FIG. 1a an air bubble defect is shown as a result of poor wetting ability of the seed layer. In FIG. 1b a bubble pit defect is shown. These defects are especially probable on aged copper seed layers. An unwanted copper thin film profile is observed which cannot meet standard requirements.

Several prior art methods are directed to ECP. U.S. Pat. No. 6,258,223 issued to Cheung, et al. describes an in-situ electroless copper seed layer enhancement in an electroplating system. U.S. Pat. No. 6,194,307 issued to Chen, et al. describes a method to eliminate copper line damages for damascene processes. U.S. Pat. No. 6,582,569 issued to Chiang, et al. describes a process for sputtering copper in a self-ionized plasma.

Accordingly one or more embodiments of the present subject matter are directed to providing a novel method of improving copper electroplating. The present subject matter presents a structure having a dielectric layer formed thereover with a dielectric layer having an opening formed therein. The opening is lined with a metal seed layer and the metal seed layer is treated with a cleaning process to increase wetting ability and thereby prevent defects in the metal plating. A metal layer is then formed upon the metal seed layer.

These and other advantages of the disclosed subject matter will be readily apparent to one skilled in the art to which the disclosure pertains from a perusal or the claims, the appended drawings, and the following detailed description of the preferred embodiments.

DETAILED DESCRIPTION

Figure 1A:
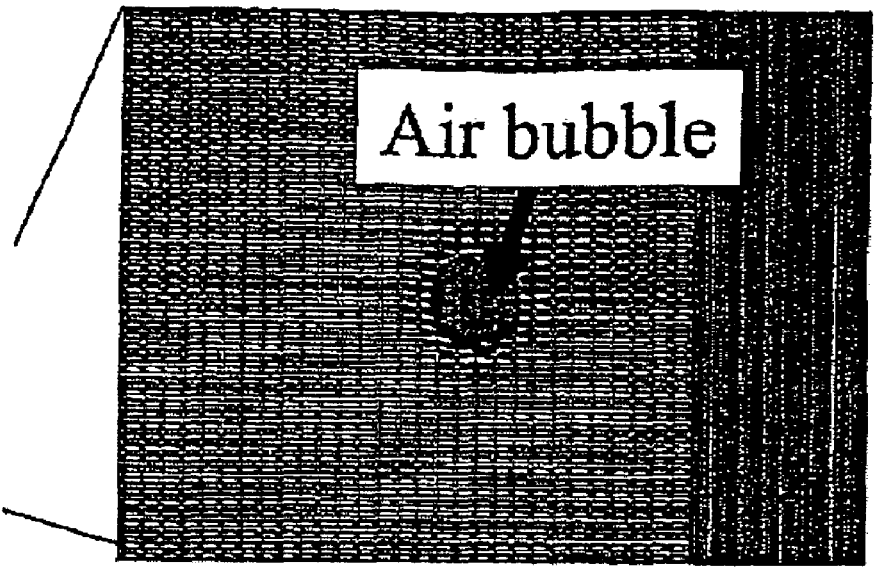
FIGS. 1a and 1b are illustrations of plating copper defects.
Figure 1B:
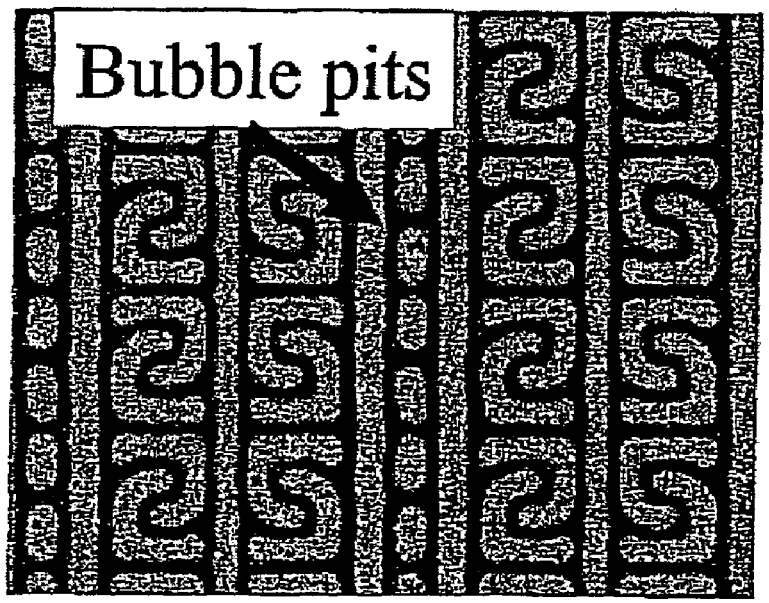
Figure 2:
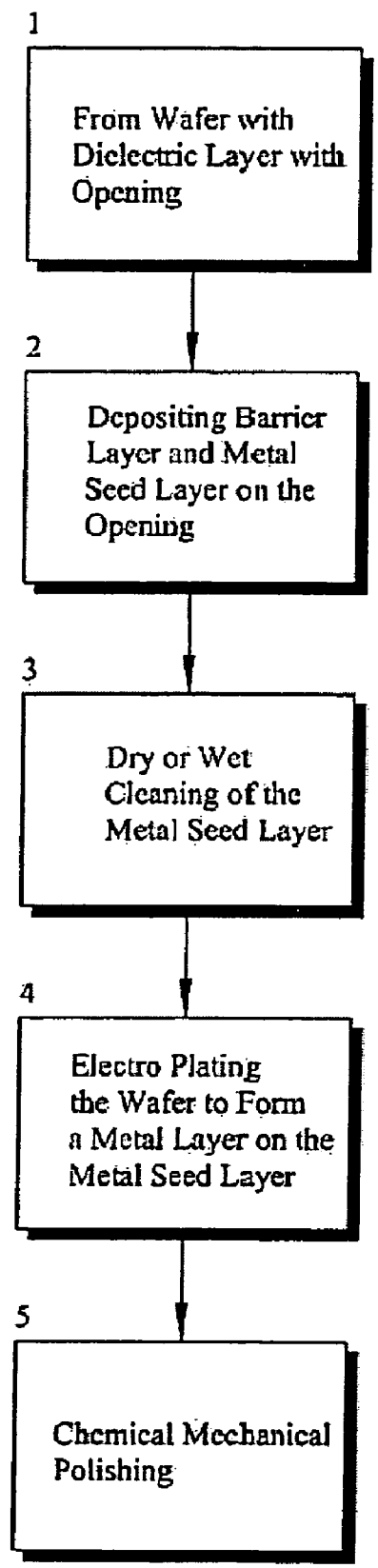
FIG. 2 is a representative flow chart of ECP method with pre ECP cleaning according to embodiments of the present subject matter FIGS. 3-6 schematically illustrate an embodiment of the present subject matter.

FIG. 2 is a graphical representation of an embodiment of the present subject matter. A wafer with a dielectric layer is formed having desired opening defined in the dielectric layer. The opening may be a damascene trench or other feature formed by a defined surface in the dielectric layer. A barrier layer and a metal seed layer are respectively deposited on the dielectric surface defining the desired opening. Prior to electrochemical plating (ECP) and subsequent to the deposition of the metal seed layer, the surface of the metal seed layer is cleaned. The current subject matter envisions wet or dry cleaning methods to improve wetting ability. The wafer is then electroplated to form a metal layer over the metal seed layer. The wafer is then subject to chemical mechanical polishing (CMP).

Wet methods of cleaning the metal seed layer may include use of a DaiNippon Screen Manufacturing Co. (DNS) cleaning tool utilizing, chemical and citric Acid, a Tel scrubber tool utilizing chemical cleaning and de-ionized water rinse, and an ECP SRD (spin-rinse-dry) module utilizing a chemical cleaning and de-ionized water rinse.

Dry methods of cleaning the metal seed layer prior to ECP envisioned include use of a PCII and PCIII chamber utilizing an Ar plasma etch and use of a PCIII chamber utilizing a helium plasma etch.

Figure 3:
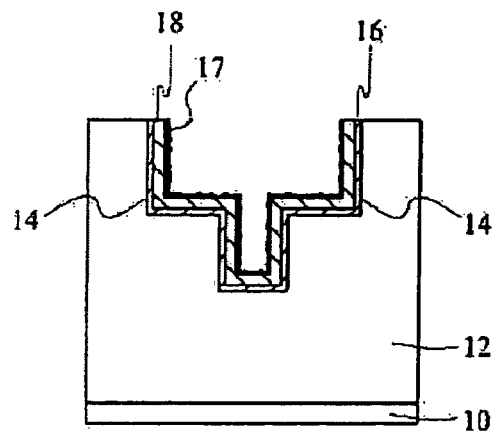

As shown in FIG. 3, a structure 10 has a dielectric layer 12 formed thereover to a thickness in the range of 2000 to 6000 Å, preferably in the range of 4000 to 5000 Å. The dielectric layer 12 may be comprised of fluorinated silica glass (FSG) or a low-k material having a dielectric constant of less than about 3.0.

The structure 10 is preferably a substrate comprised of silicon or germanium and is more preferably a silicon substrate. The structure 10 may also include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

The dielectric layer 12 includes an opening 14 formed therein which may be a damascene opening or, as shown in FIG. 3, a dual damascene opening 14 which will be used hereafter for purposes of illustration.

A single tool may be used to form the metal barrier layer 16, metal seed layer 18, and ECP layer 22. The metal barrier layer 16 and metal seed layer 18 may use electroless or electroplating methods and the ECP layer 22 may be formed using electrochemical plating.

A metal barrier layer 16 having a thickness of preferably from about 100 to 500 Å, more preferably from about 200 to 300 Å and most preferably about 300 Å is formed within the dual damascene opening 14 thereby lining the dual damascene opening 14. The metal barrier layer 16 is preferably comprised of Ta, TaN, Ti, TiN or TaSiN and is more preferably TaN or Ta.

A metal seed layer 18 having a thickness of preferably from about 1000 to 2500 Å, more preferably from about 1600 to 2000 Å and most preferably about 2000 Å is formed over the lined dual damascene opening 14. The metal seed layer 18 is comprised of the same metal as that used in the subsequent ECP process and is preferably comprised of copper (Cu). An AMT Endura system tool may be used to form the metal seed layer 18.

As shown in FIG. 3, defects 17, such as particles (contaminates) and/or metal oxides (e.g., copper oxide), $NH_3$, or $H_2S$ tend to form over the metal seed layer 18 before further processing is initiated. The wafer need only sit for a short time (i.e., a minute or more) for the seeds of defects to form or occur.

Figure 4:
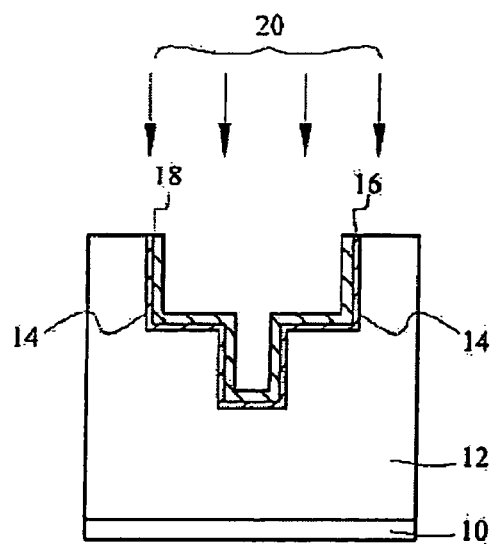

As shown in FIG. 4, a pre-ECP cleaning process 20 is employed to clean off any defects 17 formed over the metal seed layer 18 to leave a cleaned metal seed layer 18 with good wetting ability.

There are wet cleaning methods for pre-ECP cleaning of the metal seed layer that may be implemented in embodiments of the present subject matter. An embodiment uses a DNS tool, to clean the metal seed layer with a solution of citric acid. Specifically, the wafer is subjected to a solution of citric acid with a concentration in the range of 5 to 15% by weight, and preferably in the range of 8 to 10% by weight for a period ranging from 3 to 10 seconds and preferably in the range of 5 to 7 seconds; at a temperature in the range of 15 to 30° C. and preferably in the range of 20 to 25° C. (i.e., approximately room temperature).

Another embodiment utilizes a TEL scrubber tool to subject the metal seed layer 18 to de-ionized water (DIW) for a period ranging from 30 to 120 seconds and preferably in the range of 50 to 60 seconds; and at a temperature ranging from 15 to 30° C. and preferably in the range of 20 to 25° C. (i.e., approximately room temperature).

A further embodiment utilizes an ECP SRD module to perform the pre-ECP cleaning of the metal seed layer 18. The metal seed layer 18 is subjected to DIW for a period in the range of 10 to 90 seconds and preferably in the range of 30 to 60 seconds at a temperature in the range of 15 to 30° C. and preferably in the range of 20 to 25° C.

Dry cleaning methods for pre-ECP cleaning of the metal seed layer are also envisioned for implementation in some embodiments. In one embodiment, a PCII or PCIII chamber, each manufactured by AMT, is used to subject the metal seed layer to an Argon (Ar) plasma etch. In the Ar etch, the Cu seed layer 18 thickness is reduced in the range of 100 to 300 Å preferably approximately 150 Å. The etch has an Ar flow rate in the range of 3 to 10 sccm and preferably in the range of 4 to 7 sccm at a plasma power in the range of 300 to 500 W and preferably in the range of 390 to 450 W. The Cu seed layer is subjected to the Ar plasma etch for a period in the range of 5 to 20 seconds and preferably in the range of 10 to 15 seconds at a temperature in the range of 15 to 30° C. and preferably in the range of 20 to 25° C.

Another embodiment with dry pre-ECP cleaning of the metal seed layer utilizes a PCIII Chamber, manufactured by AMT, to perform a Helium (He) plasma etch. During the etch, the thickness of the Cu seed layer 18 is reduced in the range of 100 to 300 Å and preferably approximately 150 Å. The He flow rate for the plasma etching is in the range of 80 to 120 sccm and preferably in the range of 90 to 100 sccm at a plasma DC power in the range of 5 to 50 W and preferably in the range of 10 to 40 W. The plasma etch has a period in the range of 30 to 90 seconds and preferably in the range of 40 to 80 seconds at a temperature in the range of 15 to 30° C. and preferably in the range 15 to 30° C. The etch also includes a plasma $2^{nd}$ RF power preferably in the range of 400 to 500 watts and preferably in the range of 430 to 460 watts.

The TEL scrubber wet clean process is preferred as it has been found to provide the best wafer acceptance test (WAT) RC product results.

Other cleaning methods and tools are also envisioned for use in the current subject matter and the above embodiments are presented as examples and are not intended to limit the scope thereto.

During the seed to ECP process, the surface will likely be easily contaminated (i.e., by air pollution, particulate contamination, or oxidation formation). Using an $N_2$ charge as a fill gas reduces the metal oxide defects 17 or filters particulates in an idle waiting time window. The pre-ECP cleaning method as described above, removes these contaminates directly and keeps the surface fresh.

The cleaning of the metal seed layer 18 by the pre-ECP clean process 20 to form a the cleaned metal seed layer 18' permits complete and proper wetting of the cleaned metal seed layer 18' by the electrolyte solution during the subsequent ECP process in forming metal layer 22 thereover.

Figure 5:
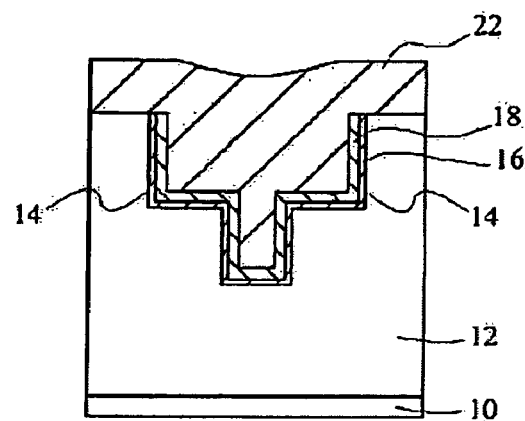

As shown in FIG. 5, regardless of which specific pre-ECP clean process 20 is selected, immediately after cleaning the metal seed layer 18 to form the cleaned metal seed layer 18', the metal layer 22 is formed over the cleaned metal seed layer 18' at least filling the dual damascene opening 14 by ECP. The metal layer 22 has a thickness in the range of 10,000 to 20,000 Å and preferably from about 12,000 to 18,000 Å with a current density in the range of 3 $A/cm^2$ to 60 $A/cm^2$ and preferably in the range of 10 $A/cm^2$ to 50 $A/cm^2$.

The plating bath for the ECP of the metal layer 22 may include $CuSO_4$, HCl, $H_2SO_4$, a suppressor and an additive. A maximum time period for the baths is in the range of up to 5 minutes and preferably having a maximum time period ranging from 1 to 4 seconds without protective voltage lapses from the pre-ECP cleaning 20 of the metal seed layer 18 to when the metal layer 22 is electrochemically plated over the cleaned metal seed layer 18'.

The metal layer 22 may be comprised of the same metal as the metal seed layer 18 preferably and is preferably comprised of copper.

Figure 6:
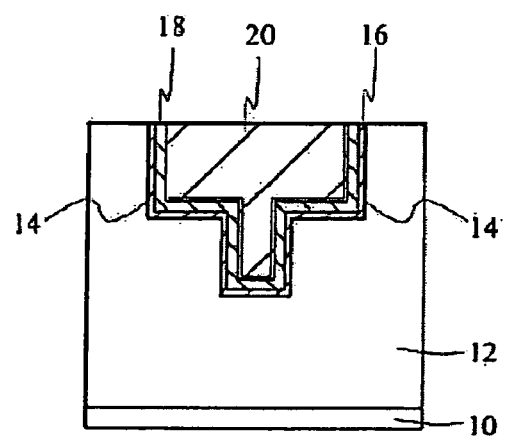

As shown in FIG. 6, the excess of metal layer 22 over the dielectric layer 12 may be removed by planarization preferably using a chemical mechanical polishing process to form a planarized (dual damascene) metal plug 22' within the (dual damascene) opening 14.

While the electrical performance differs by product type, the method of the present subject matter improves the RC value by at least about 30%. Further processing may then proceed.

Figure 7:
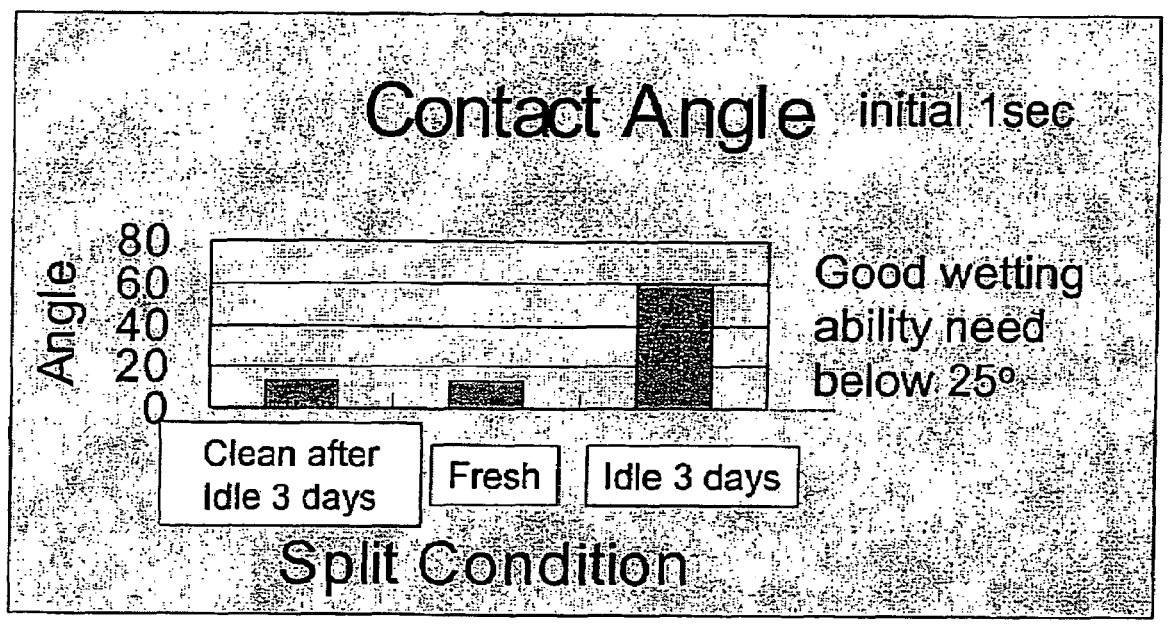
FIG. 7 is a graphic representation of contact angle for metal seed layers subjected to embodiments of the current subject matter and prior art methods.

The advantages manifested in the embodiments of the present subject matter include reduction of the chemical initial wetting contact angle, which as mentioned previously is associated with increased wetting ability, providing for uniform plating of the subsequently formed ECP metal layer, avoiding poor adhesion of the metal layer to the metal seed layer during a subsequent ECP process to thereby provide for well-controlled productivity device yield, and eliminating RC failure phenomena FIG. 7 demonstrates the effectiveness of utilizing pre-ECP cleaning of the metal seed layer according to embodiments of the current subject matter. Using the contact angle measurement to evaluate the electrolyte wetting ability, good wetting ability is indicated by a contact angle of less than 20 degrees. The contact angle of a freshly seeded metal seed layer within the initial second is less than 20 degrees; however, after remaining idle for 3 days the metal seed layer possessed a poor wetting ability as indicated by a contact angle of approximately 60 degrees. The same metal seed layer subjected to pre-ECP cleaning after an idle time of 3 days had a contact angle of less than 20 degrees, i.e., the same as the freshly seeded metal layer.

Figure 8:
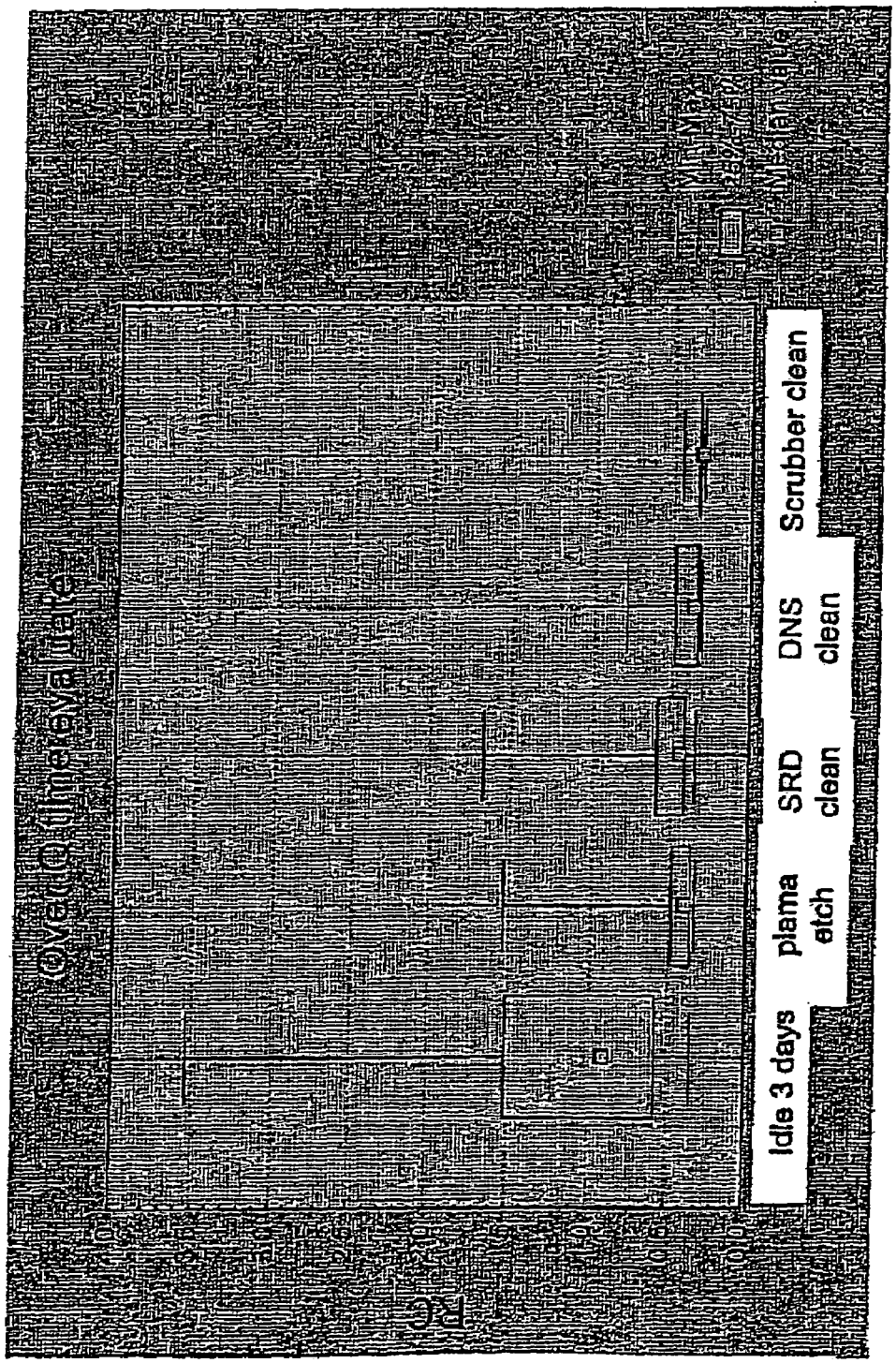
FIG. 8 is a graphic representation of RC products.

FIG. 8 is a comparison of pre-ECP cleaning methods conducted on a metal seed layer idle for 3 days. The dry cleaning method utilized a plasma etch, the wet cleaning methods utilized SRD and DNS machines, all exhibited large improvements in reducing the RC product from the non-clean metal seed layer. The metal seed layer cleaned with a TEL scrubber had the best reduction in RC product.

While particular embodiments of the present subject matter have been illustrated and described, it is not intended to limit the subject matter, except as defined by the following claims.

What we claim is:

1. A method of forming a metal layer, comprising the steps of:
    providing a semiconductor structure;
    forming a dielectric layer over the semiconductor structure, wherein the dielectric layer comprises an opening formed therein;
    lining the opening with a metal seed layer;
    treating the metal seed layer with a wet or dry cleaning process; and
    forming a metal layer upon the metal seed layer;
    wherein the wet cleaning process comprises a scrubber cleaning process and the dry cleaning process comprises a helium plasma etch or an argon plasma etch.

2. The method of claim 1, wherein the metal layer is formed by electrochemical plating or physical vapor deposition (PVD) sputtering.

3. The method of claim 1, wherein the metal seed layer and the metal layer are copper.

4. The method of claim 1, wherein the metal seed layer has a thickness in the range of approximately 1000 to 2500 Å.

5. The method of claim 1, further comprising a step of planarizing the metal layer to form a planarized metal plug within the opening.

6. The method of claim 1, further comprising a step of lining a metal barrier layer upon the opening and underneath the metal seed layer.

7. The method of claim 6, wherein the metal barrier layer is Ta, TaN, Ti, TiN or TaSiN.

8. The method of claim 6, wherein the metal barrier layer has a thickness in the range of approximately 100 to 500 Å.

9. The method of claim 1, wherein the wet clean process is a machine cleaning process employing a citric acid, or a spin-rinse-dry module machine cleaning process.

10. The method of claim 9, wherein the scrubber machine cleaning process employs de-ionized water at a time period in the range of approximately 50 to 60 seconds and at a temperature in the range of approximately 20 to 25° C.

11. The method of claim 9, wherein the spin-rinse-dry module machine cleaning process employs de-ionized water at a time in the range of approximately 30 to 60 seconds and at a temperature in the range of 20 to 25° C.

12. A method of electrochemical plating metal, comprising the steps of:
    providing a semiconductor structure;
    forming a dielectric layer over the semiconductor structure, the dielectric layer having a defined surface;
    lining the defined surface with a metal seed layer;
    treating the metal seed layer with a wet or dry cleaning process; and
    electrochemically plating a metal layer upon the metal seed layer;
    wherein the wet cleaning process comprises a scrubber cleaning process and the dry cleaning process comprises a helium plasma etch or an argon plasma etch.

13. The method of claim 12, wherein the metal seed layer and the metal layer are each comprised of copper.

14. The method of claim 12, further comprising the step of planarizing the metal layer to form a planarized metal plug within the opening.

15. The method of claim 12, further comprising the step of lining a metal barrier layer upon the defined surface and underneath the metal seed layer.

16. A method of electrochemical plating metal, comprising the steps of:
    providing a semiconductor substrate;
    forming a dielectric layer over the semiconductor substrate, the dielectric layer having an opening formed therein;
    lining the opening with a copper seed layer;
    treating the copper seed layer with a wet or dry cleaning process to remove contaminants therefrom; and,
    electrochemically plating a copper layer upon the copper seed layer;
    wherein the wet cleaning process comprises a scrubber cleaning process and the dry cleaning process comprises a helium plasma etch or an argon plasma etch.

17. The method of claim 16, further comprising the step of lining a copper barrier layer upon the opening and underneath the copper seed layer.

* * * * *